(12) United States Patent
Berndlmaier et al.

(10) Patent No.: US 6,455,336 B1
(45) Date of Patent: Sep. 24, 2002

(54) POWER REDUCTION METHOD AND DESIGN TECHNIQUE FOR BURN-IN

(75) Inventors: Zachary E. Berndlmaier, North Hero, VT (US); Mark R. Bilak, Sandy Hook, CT (US); Norman J. Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,381

(22) Filed: Aug. 27, 2001

(51) Int. Cl.[7] ............................................. H01L 21/66
(52) U.S. Cl. ........................................................ 438/14
(58) Field of Search ............................ 438/14; 714/733, 714/724; 324/73; 364/580

(56) References Cited

U.S. PATENT DOCUMENTS

| | | |
|---|---|---|
| 4,527,254 A | 7/1985 | Ryan et al. |
| 4,711,024 A * | 12/1987 | Russell .................... 29/832 |
| 5,315,598 A | 5/1994 | Tran |
| 5,636,171 A | 6/1997 | Yoo et al. |
| 5,654,930 A | 8/1997 | Yoo et al. |
| 5,926,423 A | 7/1999 | Jeong |
| 5,930,269 A | 7/1999 | Tsukamoto et al. |
| 5,956,279 A | 9/1999 | Mo et al. |
| 6,026,038 A | 2/2000 | Cho et al. |
| 6,125,465 A * | 9/2000 | McNamara ................. 714/733 |

* cited by examiner

*Primary Examiner*—John F. Niebling
*Assistant Examiner*—Andre C Stevenson
(74) *Attorney, Agent, or Firm*—Scully, Scott, Murphy & Presser; Robert A. Walsh

(57) ABSTRACT

A design and burn-in technique that effectively reduces power consumption during burn-in for devices with high power consumption as a result of shrinking voltages, high instantaneous current, subthreshold leakage and high currents at stress conditions. Three methods of reducing power consumption during burn-in are disclosed in detail: (1) completely separate power grids, (2) isolated grids during burn-in, and (3) isolated grids for MTCMOS used during burn-in. Each technique provides a method of segmenting the power supply of a chip and controlling which segment of the chip is stressed based on which segment is 'powered on'. Those segments not being stressed are 'shutoff' so as to reduce power consumption.

17 Claims, 2 Drawing Sheets

POWER REDUCTION METHOD AND DESIGN TECHNIQUE FOR BURN-IN

BACKGROUND OF THE INVENTION

1. Field of the Invention

The present invention relates generally to a power reduction method and design technique for the burn-in of chips and electrical devices, and more particularly pertains to a design and burn-in technique that effectively reduces power consumption during burn-in for devices that have high power consumption at stress conditions.

2. Discussion of the Prior Art

Burn-in provides a means of accelerating reliability testing of defects in chips that are activated by high temperatures and/or voltages by raising the temperature and voltage of the chips for some duration of time to conditions that will significantly accelerate those defects (i.e. IBM typically requires burn-in at 140˘ISC, at 1.5×Vusage). Factors such as technology advancement in submicron processing, device design and increasingly complex device designs incorporating millions of transistors have made burn-in of chips much more difficult because of factors such as substantially higher instantaneous current and subthreshold leakage which contribute to high currents at burn-in conditions. As the size of devices continues to shrink and designs incorporate more transistors, many large scale chip designs can no longer be burned-in using standard manufacturing burn-in tools. Very expensive and low capacity high-power burn-in tools are becoming more essential as changes in technology drive the need for this capability. Some present techniques for extending the life of standard manufacturing burn-in tools include:

(1) Depopulate the burn-in oven to provide better heat dissipation characteristics in the oven. Drawback: Lower throughput (less parts burned-in per stress).

(2) Reduced burn-in conditions (i.e. lower temperatures and voltages)._ Drawback: Burn-in duration exponentially increases in order to satisfy-reliability_targets.

(3) Screen parts prior to burn-in in order to weed out high power parts.Drawback: The extensive resources required to perform correlation and maintain in a manufacturing environment. Process variations over time may require further analysis to reevaluate the screening process. This also poses a problem with respect to high power parts that are screened out and must be tested in some other manner.

(4) Individual Chip Temperature Control (ICTC) where each chip is heated individually to stress conditions-.Drawback: Extends today's toolset capability from 3 watts/part maximum to about 10 watts/part.

SUMMARY OF THE INVENTION

Accordingly, it is a primary object of the present invention to provide a power reduction method and design technique for burn-in.

A further object of the subject invention is the provision of a design and burn-in technique that effectively reduces power consumption during burn-in for devices that have shrinking voltages, high instantaneous current, subthreshold leakage, high currents at stress conditions and high thermal dissipation.

The present invention provides a power reduction method and design technique for burn-in that is easily implemented into current ASIC and microprocessor design techniques, and that reduces chip power consumption during burn-in. More specifically, the power reduction method and design technique is compatible with LSSD (Level Sensitive Scan Design) scan architecture which is used in ASIC libraries and microprocessor designs, and can be used to exercise parts during burn-in.

The present invention segments the chip design into different segments, each segment having a corresponding power supply segment. Each chip section is tested at elevated stress conditions one section at a time by powering on only the power supply segment that corresponds to the chip section under test. All other power supply segments are powered off, thereby reducing power consumption during burn-in. This process is repeated for each chip segment until all segments are burned-in.

The segmenting of the power supply can be implemented by several methods. Three methods are discussed herein: 1. Completely separate power plane segments or grids;2. Isolated power plane segments or grids during burn-in;3. Isolated power plane segments or grids for MTCMOS used during burn-in.

BRIEF DESCRIPTION OF THE DRAWINGS

The foregoing objects and advantages of the present invention for a power reduction method and design technique for burn-in may be more readily understood by one skilled in the art with reference being had to the following detailed description of several embodiments thereof, taken in conjunction with the accompanying drawings wherein like elements are designated by identical reference numerals throughout the several views, and in which:

FIG. 1 illustrates a first method wherein separate power plane segments are formed into completely independent power planes, one for each chip section, and each power plane segment and chip section is powered on one at a time during their stress portion of the burn-in.

DETAILED DESCRIPTION OF THE INVENTION

Figure 1:
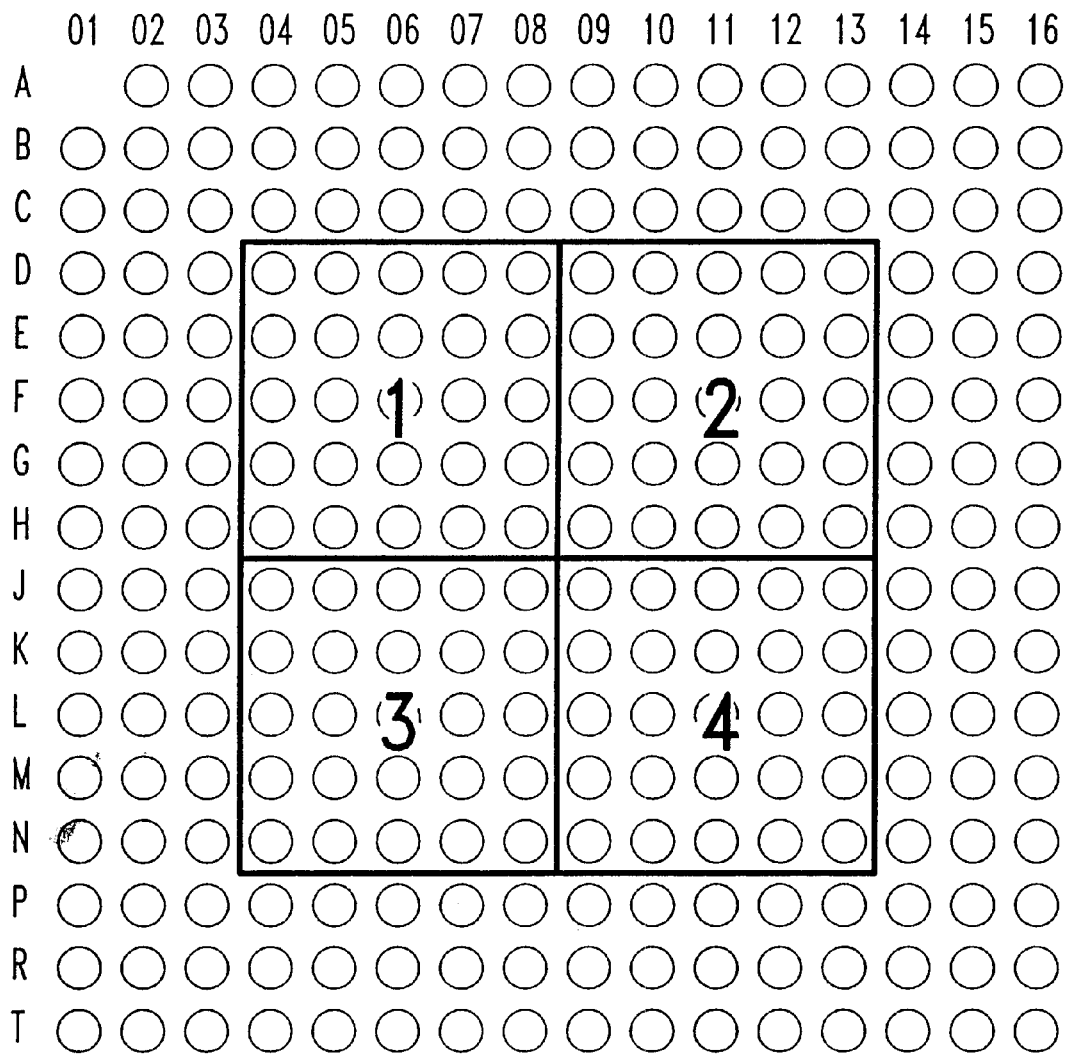

FIG. 1 is a view of the back, pin-out portion of a semiconductor chip package, and shows an array of pins on the back of the semiconductor package. FIG. 1 illustrates the array of pins being divided into segments 1, 2, 3 and 4. This is a very simplistic illustration within the context of the present invention, and a more realistic illustration would probably include very irregular and oddly shaped segments, wherein each segment might include pins both in clustered groups and pins spaced apart from the groups.

To segment the power supply for a semiconductor chip pursuant to the present invention, initially the semiconductor chip must be logically divided into different sections according to different functions or logical blocks. The segmentation may include grouping random logic blocks, but preferably the segmentation is done according to functional blocks. The power supply grid of the chip is then segmented such that each power supply segment corresponds to one of the chip sections. The power supply segment to chip section assignments are easily brought out to the package. For instance, for a microprocessor chip having a memory including a SRAM cache, an ALU, logic circuits, an integer unit and a floating point unit, chip section 1 might include the SRAM cache, chip section 2 might include the ALU, chip section 3 might include the integer unit, and chip section 4 might include the floating point unit.

The pins for power segment 1 for chip section 1 would include all power supply and ground pins for the SRAM cache, which would likely include an irregular grouping of all power supply and ground pins for the SRAM, not similar to the simple square 5×5 array of pins for segment 1 shown in FIG. 1.

Similarly, the pins to supply power and ground connections for power segment 2 for chip section 2, the ALU, would also likely include an irregular grouping of pins, and similarly for power segments 3 and 4 for chip sections 3 and 4.

A preferable number of chip sections are the minimum number of sections required to be individually powered-on and stressed during burn-in such that the power consumption is within a specified limit. This approach enables the chip to be burned-in at the maximum allowable conditions (i.e. voltage and temperature) while minimizing the overall stress duration of the chip. For instance, the number of and types of segments and sections for a microprocessor chip would be entirely different from the number of and types of segments and sections for a DRAM chip.

Method 1: FIG. 1 illustrates a first method wherein separate power_plane segments are formed as completely independent power planes within the chip,_where each plane supplies power to one of the sections of the chip. During burn-in, the chip is logically divided into n chip sections, wherein n=4 in FIG. 1 so that each pattern toggles logic in only one section of the chip at a time. All test patterns related to each chip section are grouped (i.e. there will be n groups of test patterns for n chip sections). The chip power supply grid is then physically segmented into n segments (the same number of logical chip sections). Each logical section is independently connected to one of the n power grid segments, thereby isolating each chip section from all other chip sections with respect to power during burn-in of each section. During burn-in, each power supply segment is powered on one at a time while the remaining sections are powered off, thereby stressing each chip section once during the burn-in process. During normal operation, all power segments and therefore all chip sections are powered on to their normal power values, thereby essentially providing one normal power grid for the entire chip.

Method 1 is more of a hardwired approach than Methods 2 and 3, and Method 1 achieves physical segmentation of the power supply of a chip. Method 1 could possibly be initially implemented in the initial design of the semiconductor package or chip wherein the initial design and layout of the semiconductor package or chip could possibly take into account separate chip sections and power plane segments, each of which would be powered on separately during different portions of the burn-in.

One embodiment could incorporate a chip that utilizes a scan architecture such as IBM chips wherein a series of latches are incorporated into the chip, and during test of the chip, test data is successively clocked through the chip, results are captured in each latch and successively clocked out of the chip and checked against expected data. This embodiment with a scan architecture requires that the scan path (data in and out path) be powered on at all times during burn-in so that data patterns can be loaded into the chip. This would require a separate power grid (or pins) for the scan logic (latches, JTAG (joint Test Action Group-IEEE test standard) circuits, etc.). During burn-in, each power plane segment and chip section is stressed one at a time using the previously generated test patterns for each respective chip section by loading the respective scan patterns through the scan path. All other chip sections not being stressed are physically powered off by utilizing the physical power grid segmentation, thereby significantly reducing leakage currents and effectively reducing the power consumed by the chip under stress. It would be obvious to those skilled in the art to extend the embodiment illustrated in FIG. 1 from (4) chip sections each having a 5×5 power grid to any number of chip sections with any assignment of power pins to each segment. The present invention is not limited to any particular power pin/grid layout and therefore is applicable to any integrated circuit implementation (i.e. semiconductor wafer, temporary chip attach, etc.) or integrated circuit and package assembly.

Method 2: If undesirable to have completely isolated and separate power planes, a second method places a switch between the different segment power supply planes.

Figure 2:
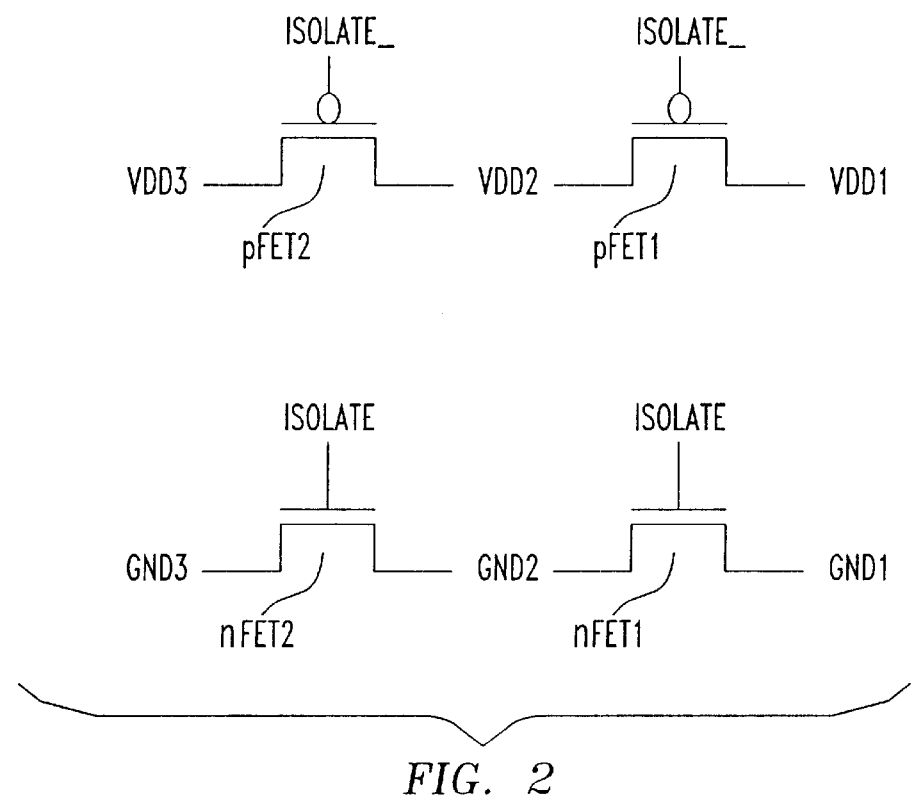
FIG. 2 illustrates a second method which places a switch between the different power supply planes of different chip sections.

FIG. 2 illustrates the second method which places a switch between the different segment power supply planes, switch pFET1 between power supplies VDD1 and VDD2, switch pFET2 between power supplies VDD2 and VDD3, and etc., switch nFET1 between grounds GND1 and GND2, and switch nFET2 between grounds GND2 and GND3, and etc.

Each switch is a fairly large device as it switches between power supplies, and can be a simple FET (pFET for VDD or nFET for GND).

During burn-in, all switches are opened, to provide separate power supply planes as in method 1), thereby allowing each chip section to be stressed independently of every other chip section.

During normal operation, all planes are powered up and the switches between the different segment power supply planes are shorted to provide one continuous power supply plane.

Method 3: MTCMOS types of circuits naturally provide for separate voltage segments, wherein each segment can be powered off when not in use by the chip.

Figure 3:
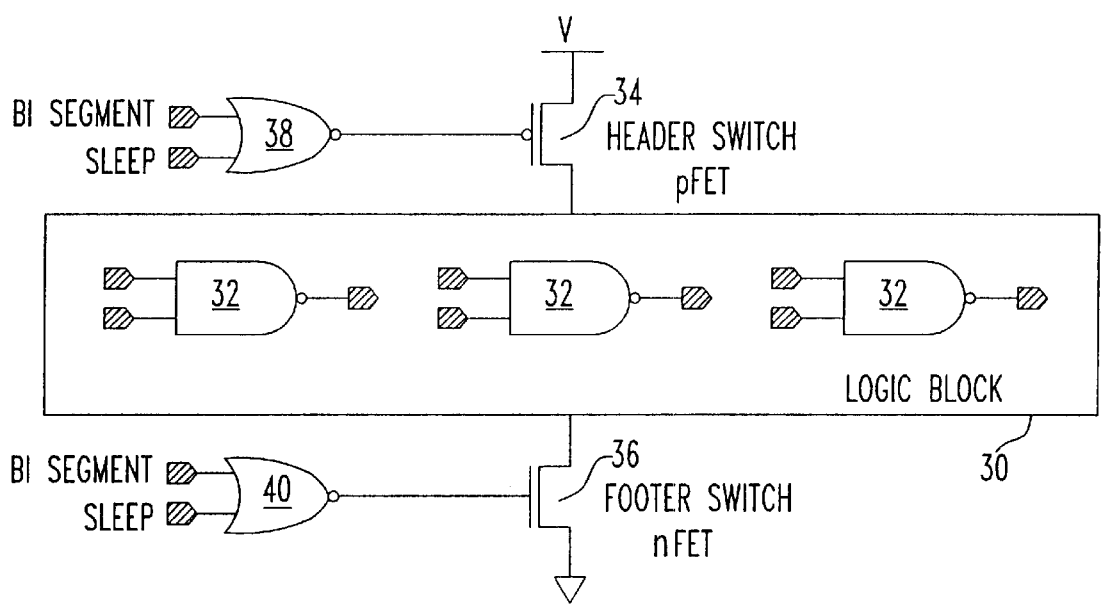
FIG. 3 illustrates the separate voltage segments for MTCMOS which naturally provides for separate voltage segments, wherein each voltage segment and chip section is run at a different power supply voltage or powered off when not in use by the chip.

FIG. 3 illustrates the separate voltage segments, wherein each segment can be powered off when not in use by the chip. This approach allows for a header or footer device to isolate the separate voltage segments, having a virtual supply rail. To follow MTCMOS, a NOR/OR signal can be added to the header/footer switch or device to allow for control of each segment during burn-in similar to the control during operational mode.

FIG. 3 illustrates a logic block 30 comprised of 3 NAND gates 32, wherein logic block 30 is powered on or off by a header switch pFET 34 connected between a power supply V and the logic block 30 and a footer switch nFET 36 connected between ground and the logic block 30. A NOR gate 38 turns the pFET 34 on and off in response to a normal SLEEP signal or a burn-in (BI) Segment signal. Similarly, an OR gate 40 turns the nFET 36 on and off in response to a normal SLEEP signal or a burn-in (BI) Segment signal.

It should be noted that the scan chain power grid can be maintained at a lower voltage during n−1 stresses so that it does not receive multiple stresses during each segment burn-in.

Method 1 is more of a physical segmentation of a chip, whereas Methods 2 and 3 are more of a logical segmentation of a chip. Examining the benefits of the present invention, equivalent Burn In stress duration estimates are compared between the new segmentation technique and current art. These numbers are calculated based on IBM's CMOS 7SF copper manufacturing process. Determined by reliability evaluations, assume a burn-in of 5 hours is required to satisfy the reliability requirements of a particular chip. Also assume by using this invention and segmenting the chip into 4 sections, it can then be burned-in at the required conditions (140C, 1.5×Vdd). Assume without segmentation, that the chip can be burned-in at only 100C and 1.25×Vdd in the same tool.

The analysis shows for a chip segmented into 4 sections using this invention, 20 hours of burn-in stress would be required to satisfy reliability targets (5 hours×4 segments). Without segmentation, the chip would require 961 hours of burn-in to achieve the equivalent stress effect of 5 hours of stress at the required conditions (140C, 1.5×Vdd). This number is based upon the voltage and temperature acceleration factors associated with the manufacturing process. Compared to the segmented approach, this equates to an additional 941 hours of burn-in stress in order to provide the same part with an equivalent reliability (961 hours of stress−20 hours of stress=941 hours). These values are for short type defect mechanisms which are typically highly accelerated by voltage and temperature.

Three methods of reducing power consumption during burn-in are disclosed in detail: (1) Completely separate power grids, (2) Isolated grids during burn-in, and (3) Isolated grids for MTCMOS used by burn-in. Each technique provides a method of segmenting the power supply of a chip and controlling which segment of the chip is stressed based on which segment is "powered on". Those segments not being stressed are "shutoff" so as to reduce power consumption.

While several embodiments and variations of the present invention for a power reduction method and design technique for burn-in are described in detail herein, it should be apparent that the disclosure and teachings of the present invention will suggest many alternative designs to those skilled in the art.

Having thus described our invention, what we claim as new and desire to secure by Letters Patent is:

1. A method of reliability testing a chip which reduces power consumption and also reduces the time required for reliability testing of the chip comprising: segmenting the power supply of the chip into different segments for different chip sections; during reliability testing, providing power to one power supply segment for one section of the chip at a time while removing the power supply to sections of the chip not under test, thereby reducing power consumption during reliability testing.BUR920010030US1.

2. The method of claim 1, wherein the chip is divided into different sections according to chip functions or logical blocks.

3. The method of claim 1, wherein the power supply is segmented by providing a plurality of power supply pins and ground pins for each chip section.

4. The method of claim 1, wherein during reliability test pattern generation, the chip is divided into n sections, and each generated test pattern toggles logic in only one section of the chip at a time during reliability testing.

5. The method of claim 3, including: grouping all test patterns related to each section of the chip to provide n groups of test patterns, one for each of the n chip sections; physically segmenting the chip power supply into n segments; independently connecting one of the n power supply segments to each chip section, thereby isolating the power supply segment of each chip section from other power supply segments during reliability testing.

6. The method of claim 1, including providing a completely separate power plane segment for each different section of the chip by providing each different chip section with a set of separate power supply pins and ground pins.

7. The method of claim 6, wherein after reliability testing and during normal operation, all power supply segments are powered on to a normal operating voltage.

8. The method of claim 1, wherein the chip utilizes a scan architecture wherein a series of latches are incorporated into the chip, and during testing of the chip, data is successively clocked through the chip, results are captured in the latches, the state of the data in each latch is compared against expected data, wherein said data comparison is a match if the chip is functioning properly, and wherein the scan path is powered on at all times during burn-in so that test patterns can be loaded into the chip.

9. A The method of claim 8, including providing a separate power grid or power supply pins for the scan logic.

10. A The method of claim 8, wherein during reliability testing, each chip section is stressed one at a time using previously generated test patterns for each respective chip section by loading the respective scan patterns through the scan path, and wherein chip sections not being stressed are physically powered off by utilizing the physical power grid segmentation.

11. The method of claim 1, including; placing a switch between different power supply planes of different chip sections; during reliability testing, all switches are opened except to the power supply plane of the chip section being tested, thereby allowing each chip section to be stressed independently of all other chip sections.

12. The method of claim 11, wherein following reliability testing and during normal operation, the switches between the different power supply planes are shorted such that all power supply planes are powered to a normal power level.

13. The method of claim 11, including placing an FET switch between different power supply planes of different chip sections.

14. The method of claim 1, wherein MTCMOS provides for separate voltage segments, wherein each separate voltage segment is powered off when not in use.

15. The method of claim 14, wherein a header device or footer device isolates each separate voltage segment.

16. The method of claim 15, wherein a gating device is added to the header device or the footer device to allow control of each separate voltage segment during reliability testing.

17. The method of claim 16, wherein the gating device is an OR or NOR gate and a signal is added to the header device or the footer device to allow control of each separate voltage segment during burn-in.

* * * * *